(12) United States Patent
Kotani

(10) Patent No.: US 10,027,406 B2
(45) Date of Patent: Jul. 17, 2018

(54) ANALOG-DIGITAL SIGNAL MIXING TRANSMISSION DEVICE

(71) Applicant: TOYONAKAKEISOU CO., LTD., Toyonaka-shi, Osaka (JP)

(72) Inventor: Katsuya Kotani, Toyonaka (JP)

(73) Assignee: TOYONAKAKEISOU CO., LTD., Toyonaka-shi, Osaka (JP)

( * ) Notice: Subject to any disclaimer, the term of this patent is extended or adjusted under 35 U.S.C. 154(b) by 0 days.

(21) Appl. No.: 15/738,847

(22) PCT Filed: Jun. 23, 2016

(86) PCT No.: PCT/JP2016/068737
§ 371 (c)(1),
(2) Date: Dec. 21, 2017

(87) PCT Pub. No.: WO2017/006776
PCT Pub. Date: Jan. 12, 2017

(65) Prior Publication Data
US 2018/0167138 A1    Jun. 14, 2018

(30) Foreign Application Priority Data

Jul. 8, 2015    (JP) ................. 2015-136556

(51) Int. Cl.
*H04L 25/03*    (2006.01)
*H04L 5/22*    (2006.01)
(Continued)

(52) U.S. Cl.
CPC ........ *H04B 10/0775* (2013.01); *G08C 15/08* (2013.01); *G08C 19/22* (2013.01);
(Continued)

(58) Field of Classification Search
CPC .............................................. H04L 25/03885
See application file for complete search history.

(56) References Cited

U.S. PATENT DOCUMENTS

2015/0271037 A1* 9/2015 Wiley .................... H04B 3/462
370/252

FOREIGN PATENT DOCUMENTS

| JP | 07-295909 A | 11/1995 |
| JP | 11-342805 A | 12/1999 |

(Continued)

OTHER PUBLICATIONS

Toyonaka Instrumentation Corporation, Universal Line Technical Information, Toyonaka Instrument Corporation Website, Japan, Toyonaka Instrument Corporation, Feb. 21, 2015, 22 pages, <URL:https://web.archive.org/web/20150221231242/http://toyonakakeisou.com/06gijyutu/Gijyutu/Gijyutu.htm>.

(Continued)

*Primary Examiner* — Ross Varndell
(74) *Attorney, Agent, or Firm* — Sughrue Mion, PLLC

(57) ABSTRACT

A plurality of terminal devices 3 are connected to a parent device 1 to measure analog voltages of the terminals. Reference voltages 6 and measurement voltages 7 each having a polarity reverse to that of clocks are sequentially switched to be connected at gaps of clocks supplied by the parent device 1. Thus, the reference voltages 6 and the measurement voltages 7 of the terminal devices 3 are directly connected. With this mechanism, measurement of analog measurement signals at multiple points can be performed by use of a pair of electric wires, in which errors due to voltage drops of the measurement voltages 7 over the transmission line 2 are corrected with measurements of the reference voltages 6 whose voltage is known in advance so that precise analog measurements can be performed.

6 Claims, 4 Drawing Sheets

(51) Int. Cl.

| | | |
|---|---|---|
| *H04B 10/077* | (2013.01) | |
| *H04L 27/32* | (2006.01) | |
| *G08C 15/08* | (2006.01) | |
| *H03M 1/12* | (2006.01) | |
| *H04B 3/06* | (2006.01) | |
| *G08C 19/22* | (2006.01) | |
| *H04L 27/10* | (2006.01) | |

(52) U.S. Cl.
CPC ............... *H03M 1/12* (2013.01); *H04B 3/06* (2013.01); *H04L 5/22* (2013.01); *H04L 27/10* (2013.01); *H04L 27/32* (2013.01); *H04L 25/03885* (2013.01)

(56) References Cited

FOREIGN PATENT DOCUMENTS

| JP | 2001-159913 A | | 6/2001 |
|---|---|---|---|
| JP | 5939698 B1 | * | 6/2016 |
| WO | WO2017006776 | * | 12/2017 |

OTHER PUBLICATIONS

Toyonaka Instrument Co., Ltd. Easy construction with wiring saving: Universal line of multiple transmission, Toyonaka Instrument Co., Ltd. Homepage, Japan, Toyona Instrumentation Co., Aug. 13, 2014, 17 pages., [Search date Sep. 29, 2015], the Internet <URL:https://web.archive.org/web/20140813115824/http://www.toyonakakeisou.com/05tokui/1MainMPX/01_mpx.htm#01>.

International Search Report for PCT/JP2016/068737 dated Jul. 19, 2016 [PCT/ISA/210].

Written Opinion for PCT/JP2016/068737 dated Jul. 19, 2016 [PCT/ISA/237].

$1^{st}$ Office Action issued from Japan Patent Office for a priority JP application of the present PCT Application for JP 2015-136556 dated Sep. 29, 2015.

$2^{nd}$ Office Action issued from Japan Patent Office for a priority JP application of the present PCT Application for JP 2015-136556 dated Feb. 9, 2016.

Notice of Allowance issued from Japan Patent Office for a priority JP application of the present PCT application for JP 2015-136556 dated May 6, 2016.

* cited by examiner

ANALOG-DIGITAL SIGNAL MIXING TRANSMISSION DEVICE

CROSS REFERENCE TO RELATED APPLICATIONS

This application is a National Stage of International Application No. PCT/JP2016/068737 filed Jun. 23, 2016, claiming priority based on Japanese Patent Application No. 2015-136556 filed Jul. 8, 2015, the contents of all of which are incorporated herein by reference in their entirety.

TECHNICAL FIELD

The present invention relates to a wire-saving transmission device which can transmit a large number of analog signals of DC 1 to 5 V, 0 to 10 V and the like and transmit on/off contact signals and digital signals of integrated values of a counter in a mixed manner by using a pair of communication lines.

BACKGROUND ART

As a wire-saving transmission method of sending a plurality of signals by using less electric wires, a method of performing A/D conversion to convert an analog signal into a digital signal and sending the same together with an original digital signal in a mixed manner has been known as disclosed in Patent Document 1.

Alternatively, the method is realized by superimposing a modulated digital signal onto an analog signal of 4 to 20 mA by using a frequency shift modulation as disclosed in Patent Document 2, or the like.

What is important in these transmission methods of performing the A/D conversion to transmit the analog signal is a resolution which is greatly related to the accuracy of the A/D conversion. As the number of bits used for the transmission is increased to transmit one analog signal by using a plurality of digital signals such as 10 or 24 signals, the accuracy and resolution will enhance. However, the signal transmission efficiency will be deteriorated accordingly. In addition, when the transmission is performed in a mixed manner together with the transmission of the digital signals, the transmission amount of the digital signals decreases accordingly.

Thus, in the A/D conversion performed on the analog signal to be accurately transmitted, as the number of digital signals converted from the analog signal is increased, the amount of information converted into digital signals and transmission delay will increase.

Moreover, since the system, which superimposes the digital signal on the analog signal of 4 to 20 mA by using the frequency shift modulation to transmit the same, is based on a method that modulates the digital signal and puts the same on a common analog signal functioning as a basis, only one type of analog signal can be transmitted.

PRIOR ART DOCUMENTS

Patent Documents

Patent Document 1: Japanese Patent Laid-Open Publication No. H11-342805
Patent Document 2: Japanese Patent Laid-Open Publication No. 2001-159913

SUMMARY OF THE INVENTION

Problems to be Solved by the Invention

The present invention has been made in light of the above-described problems, and an object thereof is to realize a mechanism which transmits a large number of accurate analog signals as they are in a time-division manner without A/D conversion via less wires and transmits, without large delays, measurement values of the multiple analog signals. Another object of the present invention is to further realize, with this mechanism, a function which enables transmission of an analog signal and a digital signal in a mixed manner by using an identical transmission line and an identical electronic circuit.

Solutions to the Problems

Hereinafter, means for achieving the above objects and the effects thereof will be described. FIG. 1A shows an entire device configuration and FIG. 1B shows transmission waveforms according to one aspect of the present invention. The device configuration includes a parent device 1, a transmission line 2 and a plurality of terminal devices 3. The parent device 1 repeatedly supplies clocks 8 up to N each having a positive potential to all the terminal devices 3 through the transmission line 2 (FIG. 1B). As a method of transmitting a plurality of analog signals by using a pair of electric wires, analog signal voltages having a negative polarity measured by the respective terminal devices 3 are connected at time positions of gaps of the clocks 8, and thereby, the plurality of analog signals can be transmitted in a time-division manner as shown by all the waveforms in FIG. 1B.

Moreover, the analog voltage signals and on/off contact signals can also be transmitted in a mixed manner via the identical transmission line by using a part of bits as a transmission region of the contact signals. Furthermore, an integrated signal can also be transmitted by converting an integrated value of pulse counts of electric power consumption or the like into binary data to be transmitted by using the mechanism for transmitting the on/off digital signals.

Effects of the Invention

An object of the present invention is to transmit a large number of analog signals as they are by using a pair of electric wires and using a time division mechanism, and further, to transmit measurement values of the analog signals accurately over a long distance even on a transmission line having unknown wire resistance by transmitting the measurement voltages together with reference voltages. Moreover, this mechanism is an invention which enables a plurality of analog signals and a plurality of digital signals having contact signal information and integrated signal information to be transmitted in a mixed manner by using an identical electronic circuit and an identical transmission line, and enables the cost of a multiple-point measurement monitor system to be largely reduced as a result of the simplification of the device and the wire-saving.

Objects, features, aspects, and advantages of the present invention will become more apparent from the following detailed description and the accompanying drawings.

EMBODIMENTS OF THE INVENTION

With reference to FIGS. 1 to 4, embodiments of the present invention will be described, which embody a mechanism for transmitting a large number of analog signals and a configuration of a wire-saving transmission device which enables the analog signals, contact signals and an integrated value of a counter or the like to be transmitted in a mixed manner.

Figure 1A:
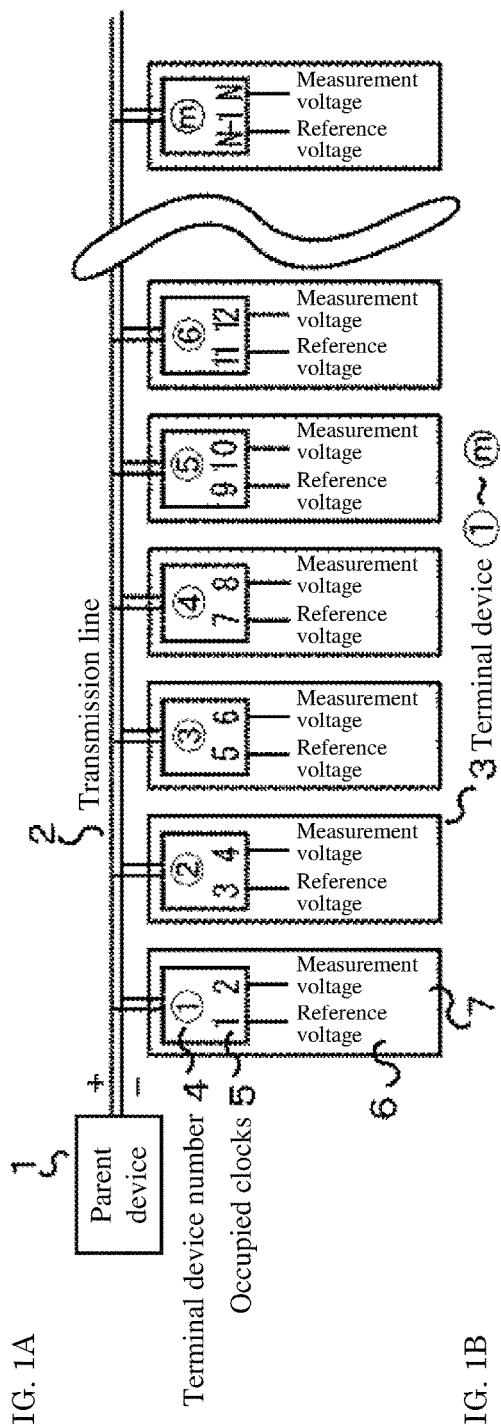
FIG. 1A is a diagram showing an entire device configuration and FIG. 1B is a diagram showing timings of transmission clocks on a transmission line and a transmission waveform.
Figure 1B:
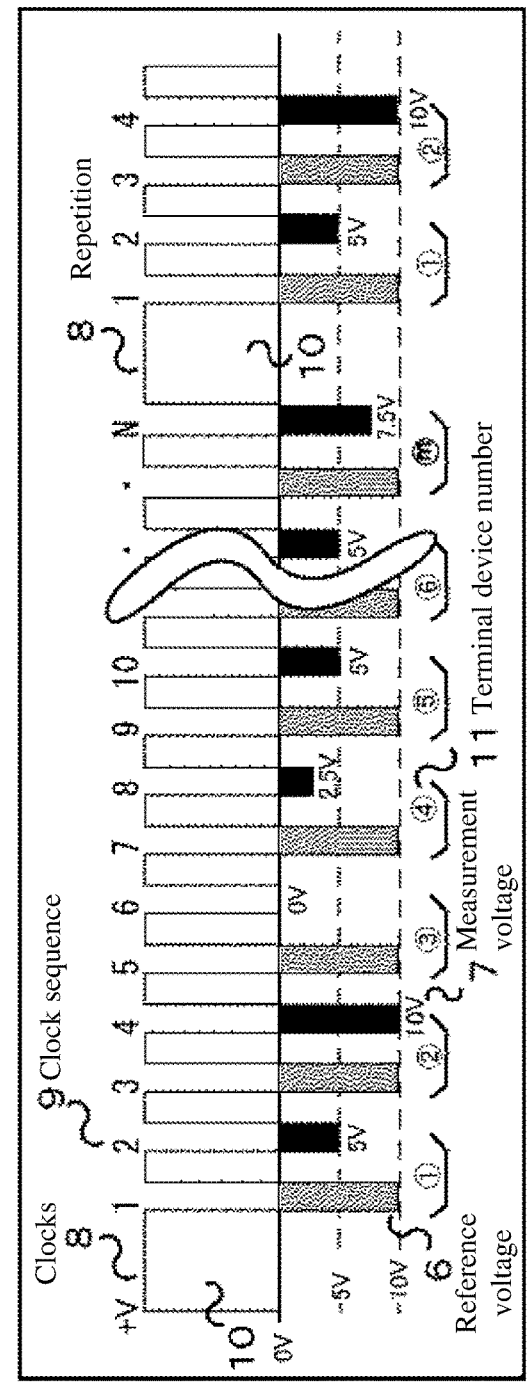

The basic configuration of the transmission device of the present invention includes a parent device 1, a transmission line 2 and a plurality of terminal devices 3 as shown in FIGS. 1A and 1B, and the transmission device is a device in which the terminal devices send out information in the form of the analog signals and digital signals to the transmission line in response to clocks supplied from the parent device.

Figure 2:
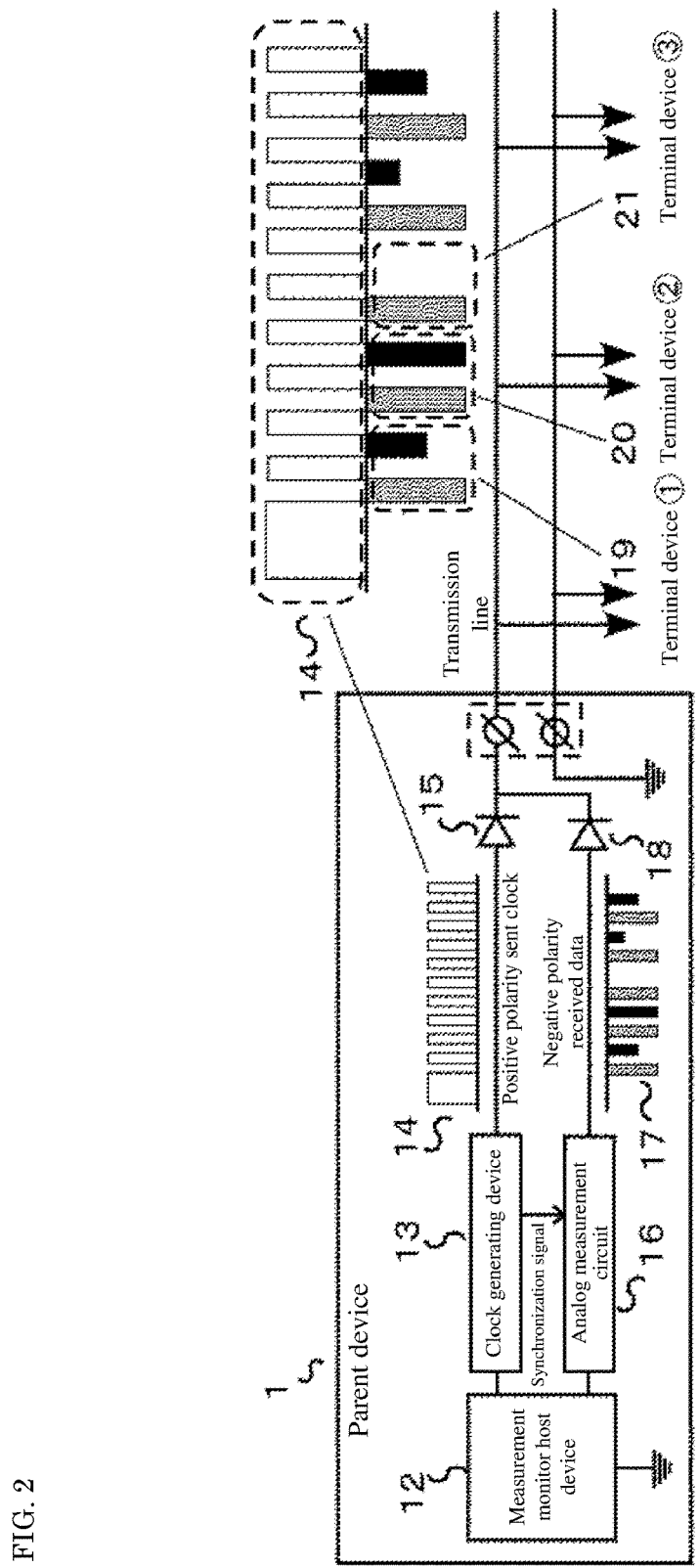
FIG. 2 is a diagram for explaining an internal configuration of a parent device and timings of the clocks on the transmission line occupied by the respective devices.

The parent device 1 generates supply clocks 14 in a clock generating device 13 shown in FIG. 2 by repeating a set of N ons and offs as shown in FIG. 1B and continuously supplies the supply clocks 14 to the transmission line 2. Every two clocks of the clocks are always occupied by one of analog input terminal devices for self-data addressing as denoted by 1 and 2 and the like for an occupied clock 5 in FIG. 1A.

Figure 3A:
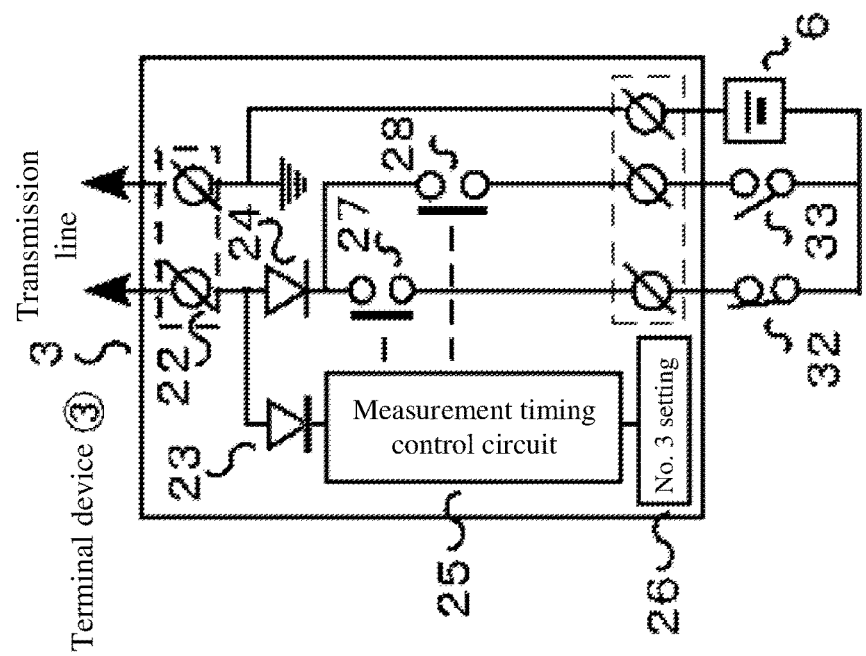
FIGS. 3A and 3B are schematic configuration diagrams of terminal devices for analog input and digital input, respectively.
Figure 3B:
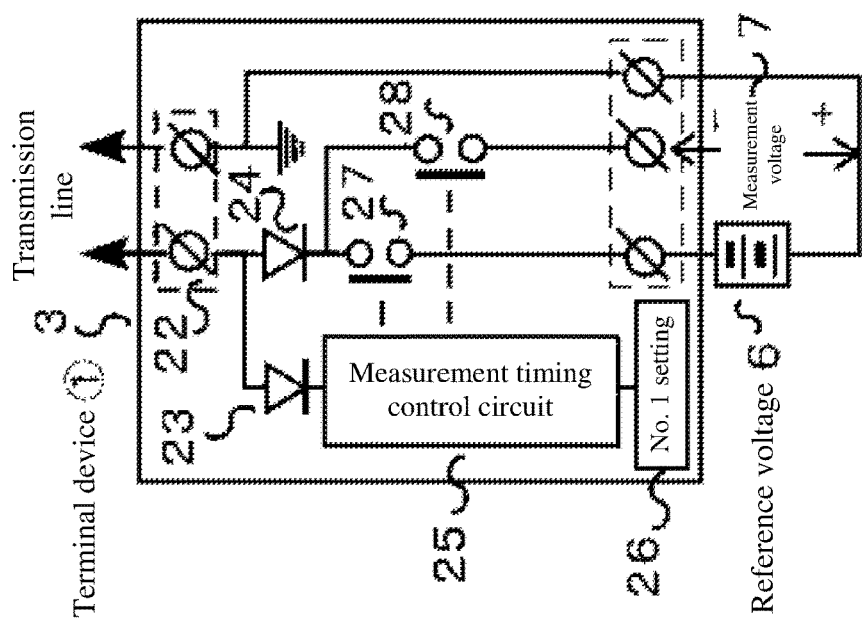

Each of the terminal devices 3 shown in FIGS. 3A and 3B occupies, as a data region, a unique time area of a falling position counted from a repetition reference 10 of clocks 8 shown in FIG. 1B. The time area is set as a self-device data address by a setter 26 with each two clocks by sequential turning-on of electronic switches 27 and 28 controlled by a measurement timing control circuit 25 shown in FIGS. 3A and 3B. This area at the clock gaps serves as a timing area for sending out data of each of the terminal devices 3.

As for measurement voltages, when the electronic switches 27 and 28 of any one of the terminal devices 3 shown in FIGS. 3A and 3B are turned on, a reference voltage 6 and a measurement voltage 7 are directly connected to an analog measurement circuit 16 through a diode 24, the transmission line and a diode 18 of the parent device 1 shown in FIG. 2 so that the analog measurement circuit 16 can directly measure each of the voltages of the terminal device 3.

The terminal devices 3 are divided into different types having an analog connection configuration shown in FIG. 3A and a digital one shown in FIG. 3B, which are different in a value and an application position of the reference voltage 6 from each other. Individual operation modes are distinguished between an analog terminal device and a digital one according to the value of the reference voltage 6 supplied at odd clock occupied by each of the terminal devices 3.

The voltage values used for identifying the operation modes of the terminal devices 3 are set with a difference between the different modes, which allows the operation modes to clearly be distinguished without being affected by a voltage drop in the transmission line, in such a way for example that the reference voltage 6 is set at 10 V for analog measurement and the reference voltages 6 is set at 5 V for contact signal input. Moreover, the reference voltage 6 is set at 15 V or the like for binary data of the integrated value.

FIG. 1B shows the voltage waveforms on the transmission line when only the terminal devices for the analog measurements are connected. The values of the reference voltages for the analog measurements are precisely set because they are used as references for correction. Each of the terminals 3 uses two bits in the data region corresponding to the clock gaps.

When the terminal device 3 set as No. 1 by the setter 26 shown in FIG. 3A turns on the electronic switch 27 shown in FIG. 3A at the first order in a clock sequence 9 shown in FIG. 1B, the reference voltage 6 of the set terminal device 3 is applied to the transmission line 2 at the timing of the first order in the clock sequence 9 shown in FIG. 1B, and the value thereof is measured by the analog measurement circuit 16 shown in FIG. 2.

The terminal device 3 subsequently turns on the electronic switch 28 shown in FIG. 3A at the timing of the "first+1" order in the clock sequence 9 shown in FIG. 1B, the measurement voltage 7 connected to the terminal device 3 is applied to the transmission line 2 at the timing of the "first+1" order in the clock sequence 9 shown in FIG. 1B, and as a result, the value thereof is measured by the analog measurement circuit 16 shown in FIG. 2.

A measurement monitor host device 12 shown in FIG. 2 calculates a voltage drop of the reference voltage over the transmission line based on the value of the reference voltage at the bit of the first order, corrects the measurement value at the bit of the "first+1" order, and measures a precise value of the measurement voltage 7 of the terminal device 3 set as No. 1.

Likewise, each terminal device for analog input connected to the transmission line 2 individually occupies two clocks and applies to the transmission line 2 the reference voltage 6 at an odd bit and the measurement voltage 7 at an even bit to transmit the voltages of each terminal device as independent measurement information as denoted by 19, 20 and 21 in FIG. 2. Thus, the values thereof can be measured by the measurement monitor host device 12 shown in FIG. 2.

The number of points of the analog measurement which can be performed by this method can be up to N/2, where N is the maximum value of the clocks. As described above, the mechanism, which performs the measurement by using the gaps of the clocks supplied from the parent device while individually performing the correction based on the reference voltage, enables precise measurement of a large number of analog signals spread over a wide area with a pair of electric wires.

FIG. 1B shows the voltage waveforms on the transmission line when only the terminal devices for the analog measurements are connected. The values of the reference voltages for the analog measurements are precisely set since they are used as references for correction. Each of the terminals 3 uses two bits in the data region corresponding to the clock gaps. Alternatively, the measurements up to the maximum value N of the clocks can be performed by using a pair of electric wires if thicknesses of the electric wires or a transmission distance are set so that the voltage drops in the transmission line can be ignored compared with the measurement values.

FIG. 3B shows the connection configuration of the terminal device 3 for contact input, in which the reference voltage 6 is for transmitting contact information of 1 and 0, and is clearly different in value from that of the terminal device for the analog measurement. This reference voltage 6 functions as a power source having a negative polarity which is applied to the transmission line at appropriate timings in order to identify on/off of switch inputs 32 and 33, which are the sources of the contact information.

Figure 4:
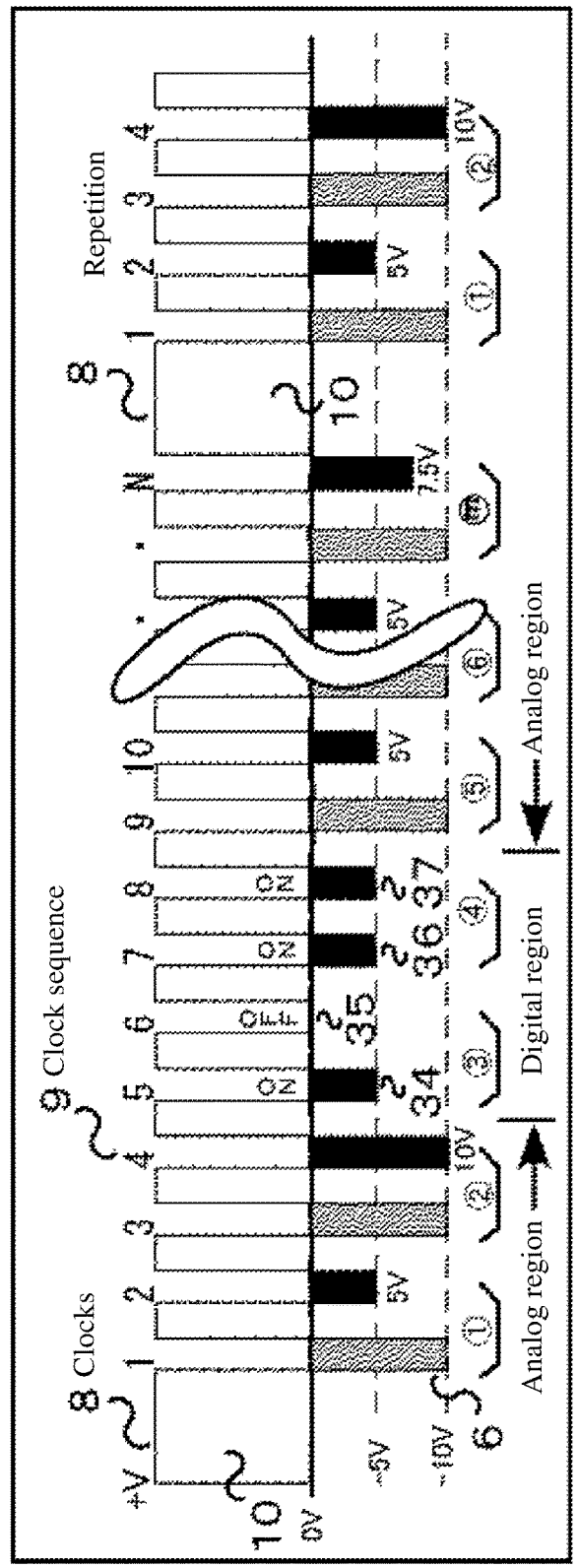
FIG. 4 is a diagram showing transmission waveforms when the analog input and the digital input exist in a mixed manner.

FIG. 4 shows voltage waveforms on the transmission line when two terminal devices 3 for the contact input shown in FIG. 3B are connected and orders 5 to 8 in the clock sequence 9 are set as contact regions. Four on/off signals of the two terminal devices appear at positions of 34, 35, 36 and 37 of the transmission waveforms and represent states of on, off, on, and on, respectively.

Any one of the terminal devices shown in FIGS. 3A and 3B can transmit a large number of analog measurements and contact signals by additionally including other ones of the occupied clocks and the electronic switches 28 and 33 controlled by the measurement timing control circuit 25.

To transmit the integrated value of the pulse counts of the power consumption or the like as binary data, a power source different in voltage from the above-described one can be used, and further electronic switches 28 and 33 shown in FIG. 3B and the occupied clocks can additionally be included. Thus, information on the integrated value can be transmitted.

The embodiments of the present invention can include the following examples.

Example 1

A signal transmission device which transmits a plurality of pieces of information via a pair of electric wires, in which each of terminal devices performs measurement at time positions of gaps of clocks having a positive polarity sent from a parent device, and connects a precise reference voltage whose value is specified and analogue signal voltage measured by the terminal device itself at the clock gaps with a polarity reverse to that of the clocks, and thereby, a plurality of analogue measurement signals are transmitted in a time division manner.

Example 2

The signal transmission device according to (Example 1), having a function which sets a magnitude of the reference voltage differently according to whether a signal transmitted by the terminal device is an analog signal or digital signal to utilize the reference voltage as an identification mark identifying an analog signal and a contact signal transmitted immediately thereafter, and transmits the analog signal and the contact signal in a mixed manner by using an identical cable.

Example 3

The signal transmission device according to (Example 1), having a function which sets the reference voltage at a value different from that in (Example 2) and transmits as binary data an integrated value of pulse counts immediately after transmitting the reference voltage to transmit an integrated value signal, the analog signal and the contact signal in a mixed manner by use of an identical cable.

This application is based on Japanese Patent Application No. 2015-136556 filed by the present applicant in Japan on Jul. 8, 2015, and the entire contents thereof are incorporated into this application by reference.

The above description of the specific embodiments of the present invention has been presented for purposes of illustration. It is not intended to be exhaustive or to limit the invention as such in the embodiments described. It is apparent to those skilled in the art that numerous variations and modifications are possible in light of the contents of the above description.

INDUSTRIAL APPLICABILITY

The mechanism according to the present invention, which enables a plurality of pieces of analog measurement information to be transmitted via a pair of electric wires, can be used for applications requiring a large number of measurements, for example, in an industrial complex, a petrochemical plant. Moreover, the function, which enables monitoring signals and control signals in contact systems, or a consumption quantity and the like such as power consumption and a steam flow rate in a factory and the like to centrally be managed, can be possibly used for many applications. The amount of electric wire usage and the cost of wiring construction can be greatly reduced, compared with the conventional method which performs analog measurements, contact signal monitoring, integrated value measurement, and the like by providing a large number of wires disposed from individual terminal devices without this system. These effects make the system more economical as the maximum clock number N is increased.

DESCRIPTION OF REFERENCE SIGNS

1: Parent device
2: Transmission line
3: Terminal device
4: Terminal device number
5: Occupied clock
6: Reference voltage
7: Measurement voltage
8: Clocks
9: Clock sequence
10: Repetition reference
11: Terminal device number
12: Measurement monitor host device
13: Clock generating device
14: Supply clock
15: Diode
16: Analog measurement circuit
17: Analog voltage
18: Diode
19: Data of the terminal device (1)
20: Data of the terminal device (2)
21: Data of the terminal device (3)
22: Transmission line terminal bed
23: Diode
24: Diode
25: Measurement timing control circuit
26: Setter
27: Electronic switch
28: Electronic switch
32: Input switch
33: Input switch
34 to 37: Transmission waveform of contact input

The invention claimed is:

1. A signal transmission device which transmits a plurality of analog measurement signals in a time-division manner, the signal transmission device comprising: a pair of transmission lines; a parent device connected to the pair of transmission lines; and a plurality of terminal devices each connected to the pair of transmission lines, wherein the parent device includes:
a circuit that generates a plurality of clocks having a first polarity and supplies the same to the pair of transmission lines; and
a circuit that takes in voltage signals having a second polarity, sent from the plurality of terminal devices through the pair of transmission lines,
the plurality of terminal devices include a plurality of analog terminal devices,
each of the plurality of analog terminal devices includes a circuit that applies, as electric potentials having the second polarity and having 0V as a base value, a reference voltage signal for measurement correction and an analog signal voltage value measured by an analog input section at time positions corresponding to adjacent two clock gaps assigned to the analog terminal device itself without being assigned in an overlapping manner to other terminal devices, and
the parent device further includes a correction circuit that corrects the analog signal voltage value sent from each of the plurality of analog terminal devices with reference to the reference voltage signal for the measurement correction sent from a corresponding analog terminal device at a time position of an adjacent clock gap.

2. The signal transmission device according to claim 1, wherein the circuit of each of the plurality of analog terminal devices applies the reference voltage signal for the measurement correction and the analog signal voltage value in this order,
the plurality of terminal devices further include a first digital terminal device,
the first digital terminal device includes a circuit that applies, as electric potentials having the second polarity and having 0V as a base value, a reference voltage signal for contact signal identification, that is different from the reference voltage signal for the measurement correction, and an on or off contact signal in this order at time positions of adjacent two clock gaps assigned to the first digital terminal device itself without being assigned in an overlapping manner to other terminal devices, and
the parent device identifies, as the contact signal based on the reference voltage signal for the contact signal identification sent from the first digital terminal device, a voltage signal sent from the first digital terminal device at a time position of an immediately subsequent clock gap.

3. The signal transmission device according to claim 2, wherein the plurality of terminal devices further include a second digital terminal device,
the second digital terminal device includes a circuit that applies, as electric potentials having the second polarity and having 0V as a base value, a reference voltage signal for plural-contact signal identification, that is different from the reference voltage signal for the measurement correction and the reference voltage signal for the contact signal identification, and a plurality of on or off contact signals in this order at time positions of three or more successive clock gaps assigned to the second digital terminal device itself without being assigned in an overlapping manner to other terminal devices, and
the parent device identifies, as the plurality of contact signals based on the reference voltage signal for the plural-contact signal identification sent from the second digital terminal device, voltage signals sent from the second digital terminal device at time positions of a plurality of immediately subsequent successive clock gaps.

4. The signal transmission device according to claim 3, wherein the plurality of contact signals are obtained by converting an integrated value of pulse counts into binary data.

5. The signal transmission device according to claim 1, wherein the circuit of each of the plurality of analog terminal devices applies the reference voltage signal for the measurement correction and the analog signal voltage value in this order,
the plurality of terminal devices further include a second digital terminal device,
the second digital terminal device includes a circuit that applies, as electric potentials having the second polarity and having 0V as a base value, a reference voltage signal for plural-contact signal identification, that is different from the reference voltage signal for the measurement correction, and a plurality of on or off contact signals in this order at time positions of three or more successive clock gaps assigned to the second digital terminal device itself without being assigned in an overlapping manner to other terminal devices, and
the parent device identifies, as the plurality of contact signals based on the reference voltage signal for the plural-contact signal identification sent from the second digital terminal device, voltage signals sent from the second digital terminal device at time positions of a plurality of immediately subsequent successive clock gaps.

6. The signal transmission device according to claim 5, wherein the plurality of contact signals are obtained by converting an integrated value of pulse counts into binary data.

* * * * *